(12) United States Patent
Kim

(10) Patent No.: US 7,567,481 B2
(45) Date of Patent: Jul. 28, 2009

(54) SEMICONDUCTOR MEMORY DEVICE ADAPTED TO COMMUNICATE DECODING SIGNALS IN A WORD LINE DIRECTION

(75) Inventor: Doo Young Kim, Sungnam-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 11/594,894

(22) Filed: Nov. 9, 2006

(65) Prior Publication Data
US 2007/0171758 A1    Jul. 26, 2007

(30) Foreign Application Priority Data
Jan. 20, 2006  (KR) ...................... 10-2006-0006052

(51) Int. Cl.
*G11C 8/00* (2006.01)
(52) U.S. Cl. ............................ 365/230.06; 365/230.01; 365/230.03; 365/230.08; 365/191
(58) Field of Classification Search ............ 365/230.06, 365/230.01, 230.03, 230.08, 191
See application file for complete search history.

(56) References Cited

U.S. PATENT DOCUMENTS

| | | | | |
|---|---|---|---|---|
| 5,808,955 A | * | 9/1998 | Hwang et al. | 365/230.06 |
| 5,848,006 A | * | 12/1998 | Nagata | 365/230.06 |
| 5,940,343 A | * | 8/1999 | Cha et al. | 365/230.06 |
| 5,986,938 A | * | 11/1999 | Jang | 365/185.23 |
| 6,064,607 A | * | 5/2000 | Miki et al. | 365/200 |
| 6,069,838 A | * | 5/2000 | Jeong | 365/230.06 |
| 6,088,286 A | * | 7/2000 | Yamauchi et al. | 365/230.06 |
| 6,107,869 A | * | 8/2000 | Horiguchi et al. | 327/544 |
| 6,188,631 B1 | * | 2/2001 | Lee et al. | 365/230.03 |
| 6,339,358 B1 | * | 1/2002 | Horiguchi et al. | 327/544 |
| 6,366,515 B2 | * | 4/2002 | Hidaka | 365/200 |
| 6,377,483 B1 | * | 4/2002 | Arimoto et al. | 365/149 |
| 6,407,942 B2 | * | 6/2002 | Aritomi et al. | 365/63 |
| 6,442,078 B1 | * | 8/2002 | Arimoto | 365/189.08 |
| 6,452,858 B1 | * | 9/2002 | Hanzawa et al. | 365/230.06 |
| 6,477,105 B2 | * | 11/2002 | Aritomi et al. | 365/230.03 |
| 6,567,328 B1 | * | 5/2003 | Higuchi | 365/205 |
| 6,618,300 B2 | * | 9/2003 | Yamakoshi | 365/200 |

(Continued)

FOREIGN PATENT DOCUMENTS

EP        000600184 A2  *  6/1994

(Continued)

*Primary Examiner*—Viet Q Nguyen
(74) *Attorney, Agent, or Firm*—Volentine & Whitt, PLLC

(57) ABSTRACT

A semiconductor memory device comprising decoding signals communicated solely in a word line direction is provided. The semiconductor memory device comprises a sub-array comprising a plurality of memory cells, a plurality of enable signal generators adapted to generate word line enable signals, a plurality of decoding signal generators adapted to generate decoding signals, a plurality of inverted decoding signal generators adapted to generate inverted decoding signals, and a word line driver area comprising a plurality of sub-word line drivers. Each sub-word line driver is adapted to drive a word line in accordance with one of the word line enable signals and a pair of first signals comprising one of the decoding signals and one of the inverted decoding signals. The word line enable signals and the decoding signals are communicated to the sub-word line drivers solely in a word line direction.

12 Claims, 10 Drawing Sheets

U.S. PATENT DOCUMENTS

| | | | |
|---|---|---|---|
| 6,657,915 B2 * | 12/2003 | Seo et al. | 365/230.06 |
| 6,882,588 B2 * | 4/2005 | Higuchi | 365/205 |
| 6,954,398 B2 * | 10/2005 | Ninomiya et al. | 365/230.06 |
| 7,248,535 B2 * | 7/2007 | Chun | 365/230.03 |

FOREIGN PATENT DOCUMENTS

| | | | |
|---|---|---|---|
| JP | 4318392 | | 11/1992 |
| JP | 410069771 A | * | 3/1998 |
| JP | 2001023373 A | * | 1/2001 |
| JP | 2003208793 | | 7/2003 |
| KR | 10-1998-29718 | | 5/1994 |
| KR | 1020010063621 | | 7/2001 |
| KR | 1020050030468 | | 3/2005 |

* cited by examiner

SEMICONDUCTOR MEMORY DEVICE ADAPTED TO COMMUNICATE DECODING SIGNALS IN A WORD LINE DIRECTION

BACKGROUND

1. Field of the Invention

Embodiments of the invention relate to a semiconductor memory device. More particularly, embodiments of the invention relate to a semiconductor memory device including decoding signal generators adapted to generate decoding signals.

This application claims priority to Korean Patent Application No. 10-2006-6052, filed on Jan. 20, 2006, the subject matter of which is hereby incorporated by reference in its entirety.

2. Description of Related Art

A conventional semiconductor memory device includes a memory array including memory cells (which are storage elements capable of storing data) disposed in a matrix having rows and columns. In the conventional semiconductor memory device illustrated in FIG. (FIG.) 1, word lines WLs are disposed along the rows of the matrix (i.e., in a row direction), and bit lines BLs are disposed along columns of the matrix (i.e., in a column direction). Memory cells MCs are respectively disposed at intersections of word lines WLs and bit lines BLs. That is, each memory cell MC is disposed at the intersection of a word line WL and a bit line BL. Furthermore, the conventional semiconductor memory device of FIG. 1 comprises several circuits for selecting memory cells MCs and inputting and outputting data.

FIG. 1 is a layout diagram illustrating an arrangement of circuits in a conventional semiconductor memory device. As illustrated in FIG. 1, a memory array MCARR is divided into a plurality of sub-arrays S_ARRs, and a sense amplifier area BK_SA is disposed between sub-arrays S_ARRs that are separated from one another in a bit line BL direction. Furthermore, a word line driver area BK_SWD is disposed on one side of each sub-array S_ARR such that each word line driver area BK_SWD is adjacent to a sub-array S_ARR along a word line WL direction. In addition, a junction area JNC is disposed at an area where sense amplifier area BK_SA and word line driver areas BK_SWDs would intersect if sense amplifier area BK_SA extended in the word line WL direction and word line driver areas BK_SWDs extended in the bit line BL direction.

As used herein, the "word line WL direction" (or "word line direction") comprises any direction substantially parallel to a row of a sub-array S_ARR. Thus, every direction substantially parallel to a row of a sub-array S_ARR points in the word line WL direction. The arrow labeled WL in FIG. 1, for example, is pointing in the word line WL direction, and any other arrow parallel to and pointing in the same direction as or pointing in the opposite direction relative to one of the arrows labeled WL in FIG. 1 would also be pointing in the word line WL direction. The word line WL direction is indicated by arrows in other drawings as well.

Also, as used herein, the "bit line BL direction" (or "bit line direction") comprises any direction substantially parallel to a column of a sub-array S_ARR. Thus, every direction substantially parallel to a column of a sub-array S_ARR points in the bit line BL direction. The arrows labeled BL in FIG. 1, for example, are each pointing in the bit line BL direction, and any other arrow parallel to either of those arrows would also be pointing in the bit line BL direction. The bit line BL direction is indicated by arrows in other drawings as well.

Bit line sense amplifiers BLSAs adapted to detect and amplify data apparent on the bit lines are disposed in sense amplifier area BK_SA. In addition, sub-word line drivers SWDs are disposed in word line driver areas BK_SWDs.

Each of the sub-word line drivers SWDs drives a word line WL in accordance with (i.e., designated by) a word line enable signal NWE<k>, which is provided from an enable signal generator NWEG<k>, a pair of signals comprising a delay decoding signal PXD<i> and inverted decoding signal PXB<i>. Delay decoding signal PXD<i> and inverted decoding signal PXB<i> are provided from a decoding driver PXDV<i>.

Decoding drivers PXDV<1>, PXDV<2> (which are called "PX drivers") are disposed in junction area JNC. Decoding drivers PXDV<1>, PXDV<2> generate delay decoding signals PXD<1> and PXD<2> and inverted decoding signal PXB<1> and PXB<2>, which are driven in response to pre-decoding signals PX<1> and PX<2> provided from decoding signal generators PXG<1> and PXG<2>.

Furthermore, a predecoder 11 decodes a row address RADD provided from outside of the conventional semiconductor memory device of FIG. 1 and provides a first address signal XA<1> to decoding signal generators PXG<1> and PXG<2> and provides second address signals XA<2:8> to enable signal generators NWEG<1> to NWEG<128>.

For convenience of description, it will be assumed that the sub-word line drivers SWDs disposed in one of the word line driver areas BK_SWDs drive word lines WLs of a corresponding one of sub-array S_ARRs. The conventional semiconductor memory device of FIG. 1 comprises 256 word lines WLs for each sub-array S_ARR, and 256 sub-word line drivers SWDs are disposed in each word line driver area BK_SWD of the conventional semiconductor memory device of FIG. 1. For the purpose of clarity, sense amplifier area BK_SA, word line driver areas BK_SWDs, and junction area JNC of FIG. 1 are not drawn to scale.

In the conventional semiconductor device of FIG. 1, decoding drivers PXDV<1> and PXDV<2> are disposed in junction area JNC. Therefore, delay decoding signals PXD<1> and PXD<2> and inverted decoding signals PXB<1> and PXB<2>, which are generated by decoding drivers PXDV<1> and PXDV<2>, are connected to a relatively large number of sub-word line drivers SWDs, as is illustrated in FIG. 2. In the conventional semiconductor memory device of FIGS. 1 and 2, each of delay decoding signals PXD<1> and PXD<2> and each of inverted decoding signal PXB<1> and PXB<2> is connected to 128 sub-word line drivers SWDs disposed in the word-line driver area BK_SWD disposed to the right of junction area JNC and 128 sub-word line drivers SWDs disposed in the word-line driver area BK_SWD disposed to the left of junction area JNC. Thus, each of delay decoding signals PXD<1> and PXD<2> and each of inverted decoding signal PXB<1> and PXB<2> is connected to a total of 256 sub-word line drivers SWDs.

Because delay decoding signals PXD<1> and PXD<2> and inverted decoding signals PXB<1> and PXB<2> are connected to a relatively large number of sub-word line drivers SWD, delay decoding signals PXD<1> and PXD<2> and inverted decoding signals PXB<1> and PXB<2> are burdened with a relatively heavy load. In particular, when delay decoding signals PXD<1> and PXD<2> are driven to a high voltage level of boost voltage level VPP, the relatively heavy load caused by delay decoding signals PXB<1> and PXB<2> being connected to a relatively large number of sub-word line drivers SWDs in a semiconductor memory device may cause the overall operational speed of the semiconductor memory device to decrease.

SUMMARY OF THE INVENTION

Embodiments of the invention provide a semiconductor memory device in which each decoding signal is connected to fewer sub-word line drivers to decrease the load of each decoding signal.

In one embodiment, the invention provides a semiconductor memory device comprising a sub-array comprising a plurality of memory cells, a plurality of enable signal generators adapted to generate word line enable signals, a plurality of decoding signal generators adapted to generate decoding signals, a plurality of inverted decoding signal generators adapted to generate inverted decoding signals, and a word line driver area comprising a plurality of sub-word line drivers. Each sub-word line driver is adapted to drive a word line corresponding to at least one of the memory cells in accordance with one of the word line enable signals and a pair of first signals comprising one of the decoding signals and one of the inverted decoding signals. Also, the word line enable signals and the decoding signals are communicated to the sub-word line drivers solely in a word line direction.

In another embodiment, the invention provides a semiconductor memory device comprising a plurality of sub-arrays separated by sense amplifier areas, wherein each sub-array is disposed adjacent to one of a plurality of word line driver areas; pluralities of sub-word line drivers comprising a first plurality of sub-word line drivers, wherein the first plurality of sub-word line drivers comprises a plurality of driver groups and is disposed in one of the word line driver areas; and a plurality of first pluralities of decoding signal generators. In addition, the decoding signal generators are adapted to generate decoding signals, the decoding signal generators are activated in accordance with address signals, and each of the driver groups corresponds to a respective one of the first pluralities of decoding signal generators. Additionally, corresponding decoding signal generators of each first plurality of decoding signal generators are all activated in accordance with the same address signal; and each sub-word line driver of the first plurality of sub-word line drivers is adapted to drive a word line of a corresponding one of the sub-arrays in accordance with a corresponding one of a plurality of word line enable signals and a corresponding one of a plurality of pairs of first signals, wherein each pair of first signals comprises one of the decoding signals and one of a plurality of inverted decoding signals. Also, the decoding signals are communicated to the first plurality of sub-word line drivers solely in a word line direction.

BRIEF DESCRIPTION OF THE DRAWINGS

Embodiments of the invention will be described with reference to the accompanying drawings, in which like reference symbols refer to like or similar elements throughout. In the drawings.

DESCRIPTION OF EMBODIMENTS

Embodiments of the invention will be described with reference to the accompanying drawings.

Figure 3:
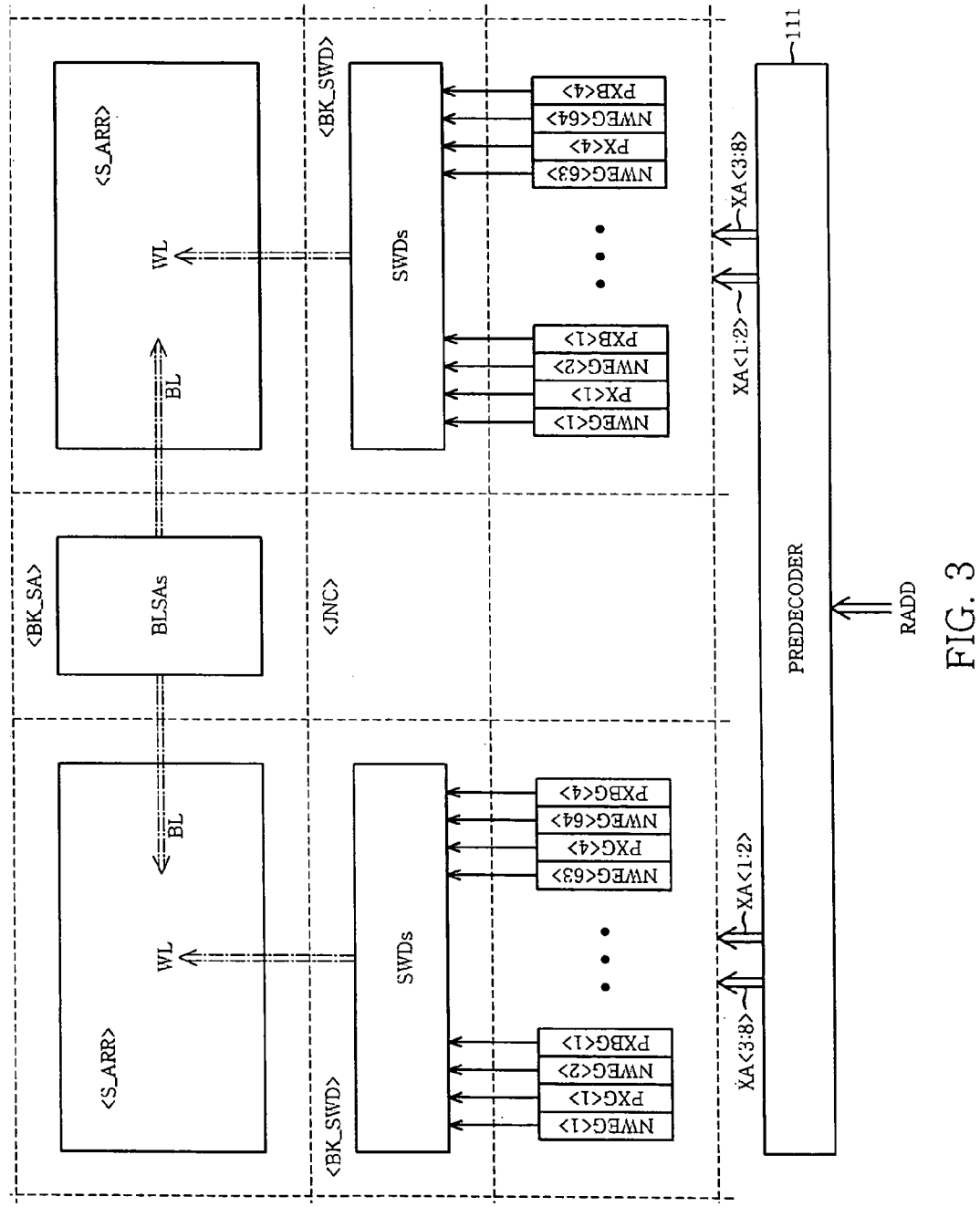
FIG. 3 is a diagram illustrating the layout of a semiconductor memory device in accordance with an embodiment of the invention.

FIG. 3 is a diagram illustrating the layout of a semiconductor memory device in accordance with an embodiment of the invention. For purposes of clarity, elements illustrated in FIG. 3 are not drawn to scale.

The semiconductor memory device of the embodiment illustrated in FIG. 3 comprises a plurality of sub-arrays S_ARRs, a plurality of sense amplifier areas BK_SAs (though only one is shown in FIG. 3), and a plurality of word line driver areas BK_SWDs.

Each of the plurality of sub-arrays S_ARRs comprises a plurality of word lines WLs, a plurality of bit lines BLs and /BLs, and a plurality of memory cells MCs. Two neighboring bit lines BL and /BL constitute a pair of bit lines. Furthermore, each memory cell MC of the plurality of memory cells MCs is disposed at the intersection of one of the word lines WLs and one of the pairs of bit lines BLs and /BLs.

Each of sense amplifier areas BK_SAs is disposed between two sub-arrays S_ARRs that are separated from one another in the bit line BL direction. Bit line sense amplifiers BLSAs are disposed in sense amplifier areas BK_SAs. Each bit line sense amplifiers BLSAs is adapted to sense and amplify data apparent on a pair of bit lines BL and /BL of a corresponding sub-array S_ARR.

Each of word line driver areas BK_SWDs is disposed on a first side of a corresponding sub-array S_ARR such that each word line driver area BK_SWD is adjacent to the first side of a corresponding sub-array S_ARR in the word line WL direction. Likewise, each sub-array S_ARR is disposed on a first side of the corresponding word line driver area BK_SWD. In addition, sub-word line drivers SWDs are disposed in word line driver areas BK_SWDs.

Figure 1:
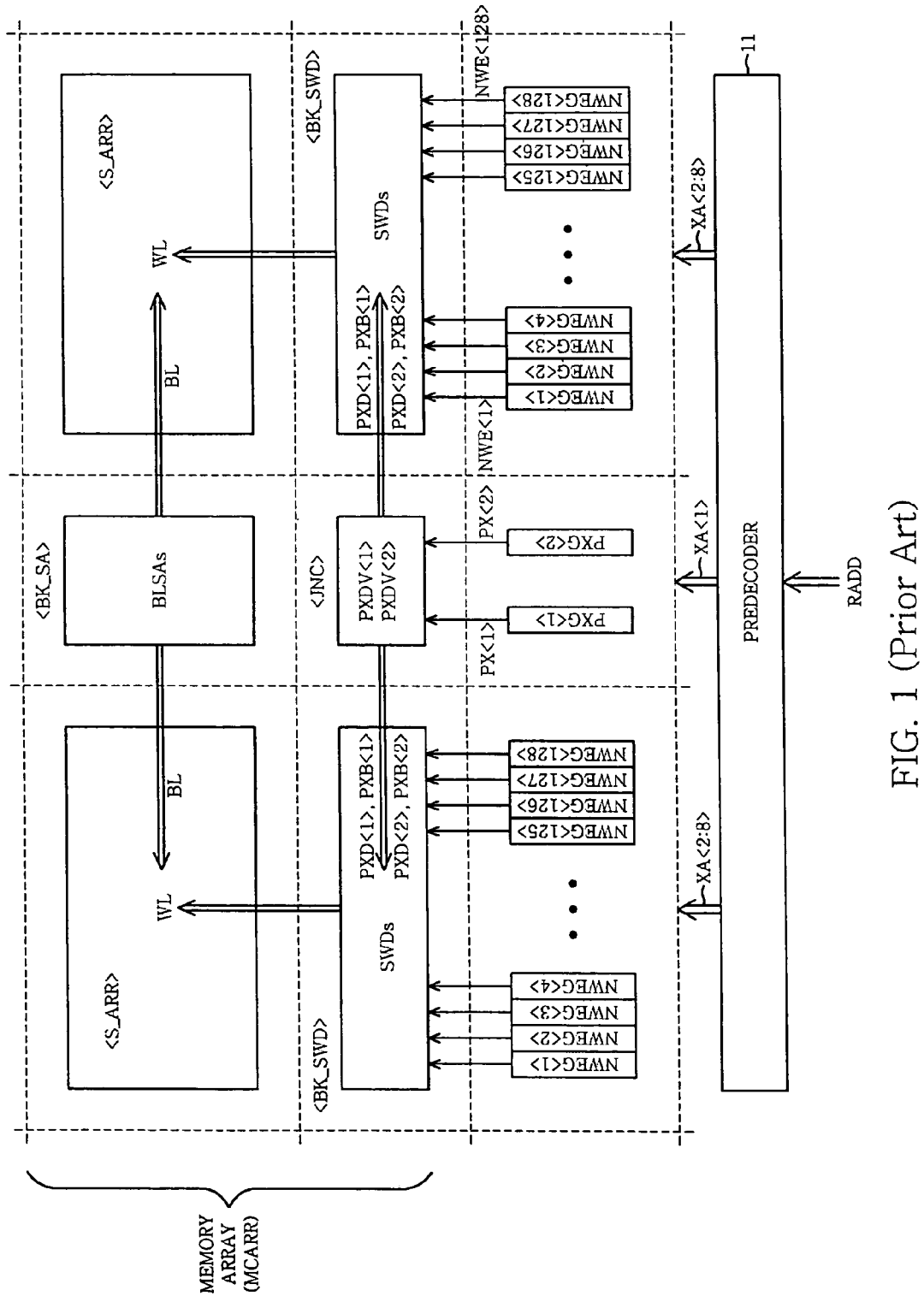
FIG. 1 is a layout diagram illustrating the arrangement of circuits in a conventional semiconductor memory device.

For convenience of description, it will be assumed that each of sub-arrays S_ARRs comprises 256 word lines, as in the conventional semiconductor memory device of FIG. 1. Also, when a word line group comprises four word lines WLs and each sub-array S_ARR comprises 256 word lines, each sub-array S_ARR comprises 64 word line groups. Furthermore, it will be assumed that each word line driver area BK_SWD corresponds to a respective one of the sub-arrays S_ARRs.

Figure 4:
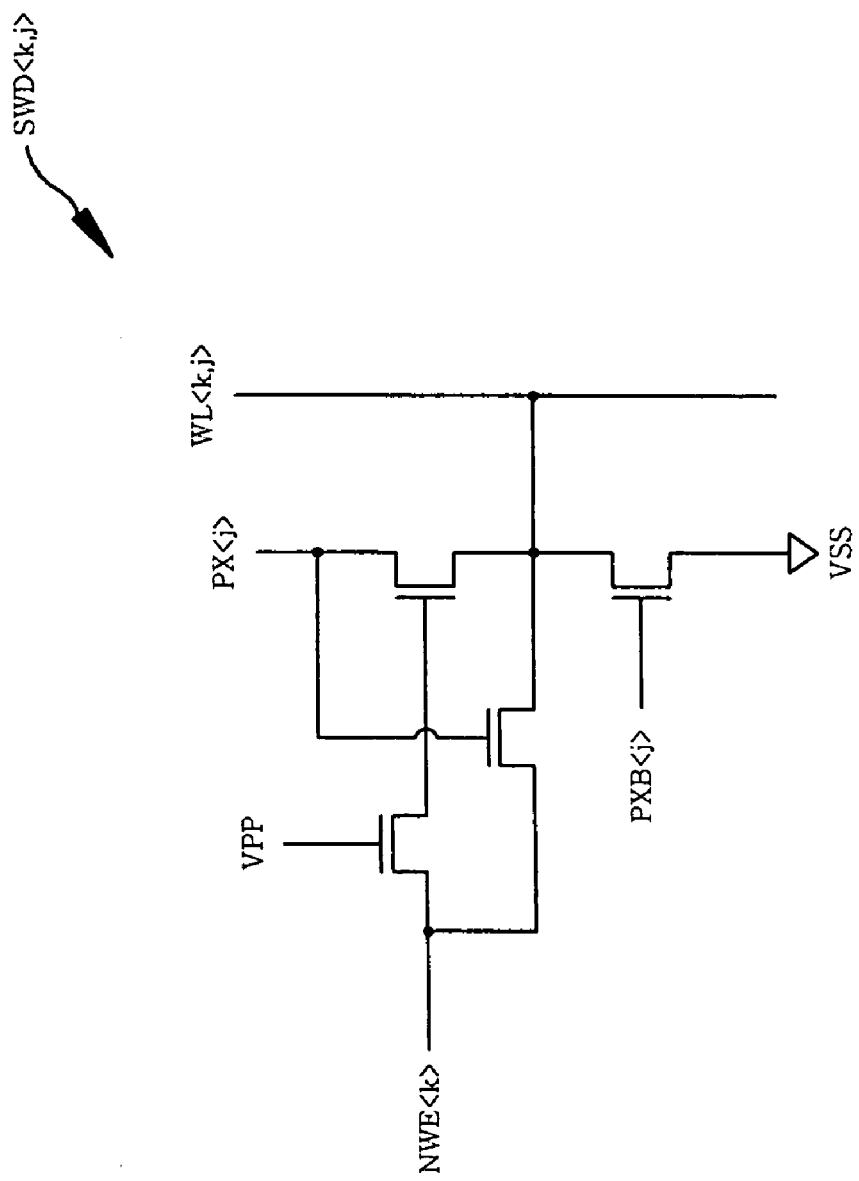
FIG. 4 is a diagram illustrating an exemplary sub-word line driver that may be disposed in a word line driver area of the semiconductor device of FIG. 3.

FIG. 4 is a diagram illustrating an exemplary sub-word line driver SWD that may be disposed in word line driver area BK_SWD of FIG. 3. The indices <k,j> that are appended to the reference character SWD in FIG. 4 indicate that sub-word line driver SWD<k,j> drives a j-th word line WL in a k-th word line group, that is, word line WL<k,j>. As used herein, "k" is a natural number between 1 and 64 inclusive, and "j" is a natural number between 1 and 4 inclusive.

Referring to FIG. 4, sub-word line driver SWD<k,j> is adapted to drive word line WL<k,j> in accordance with (i.e., designated by) word line enable signal NWE<k>, decoding signal PX<j>, and inverted decoding signal PXB<j>. That is, sub-word line driver SWD<k,j> drives word line WL<k,j> when selected (i.e., designated) by word line enable signal NWE<k>, decoding signal PX<j>, and inverted decoding signal PXB<j>.

In the embodiment illustrated in FIG. 4, word line enable signal NWE<k> selects a word line group that comprises four word lines. Furthermore, decoding signal PX<j> and inverted decoding signal PXB<j> select (i.e., designate) one of the word lines in the word line group selected by word line enable signal NWE<k>.

When word line enable signal NWE<k> has been driven to a boost voltage VPP, word line WL<k,j> is activated when decoding signal PX<j> is driven to the boost voltage VPP.

When the level of word line enable signal NWE<k> is at a ground voltage VSS, or when inverted decoding signal PBX<j> is driven to a power supply voltage VCC, word line WL<k,j> will transition to (or maintain) a ground voltage VSS.

Referring to FIG. 3 again, the semiconductor memory device of FIG. 3 comprises enable signal generators NWEG<1> to NWEG<64>, decoding signal generators PXG<1> to PXG<4>, and inverted decoding signal generators PXBG<1> to PXBG<4> that are all disposed on a second side of a corresponding word line driver area BK_SWD and disposed on the first side of the corresponding sub-array S_ARR. The second side of corresponding word line driver area BK_SWD is opposite the first side of corresponding word line driver area BK_SWD. As used herein, when a first element is disposed "on" a side of a second element, it means that the first element is disposed next to the indicated side of the second element and not that the first element is physically on top of the second element.

Figure 5A:
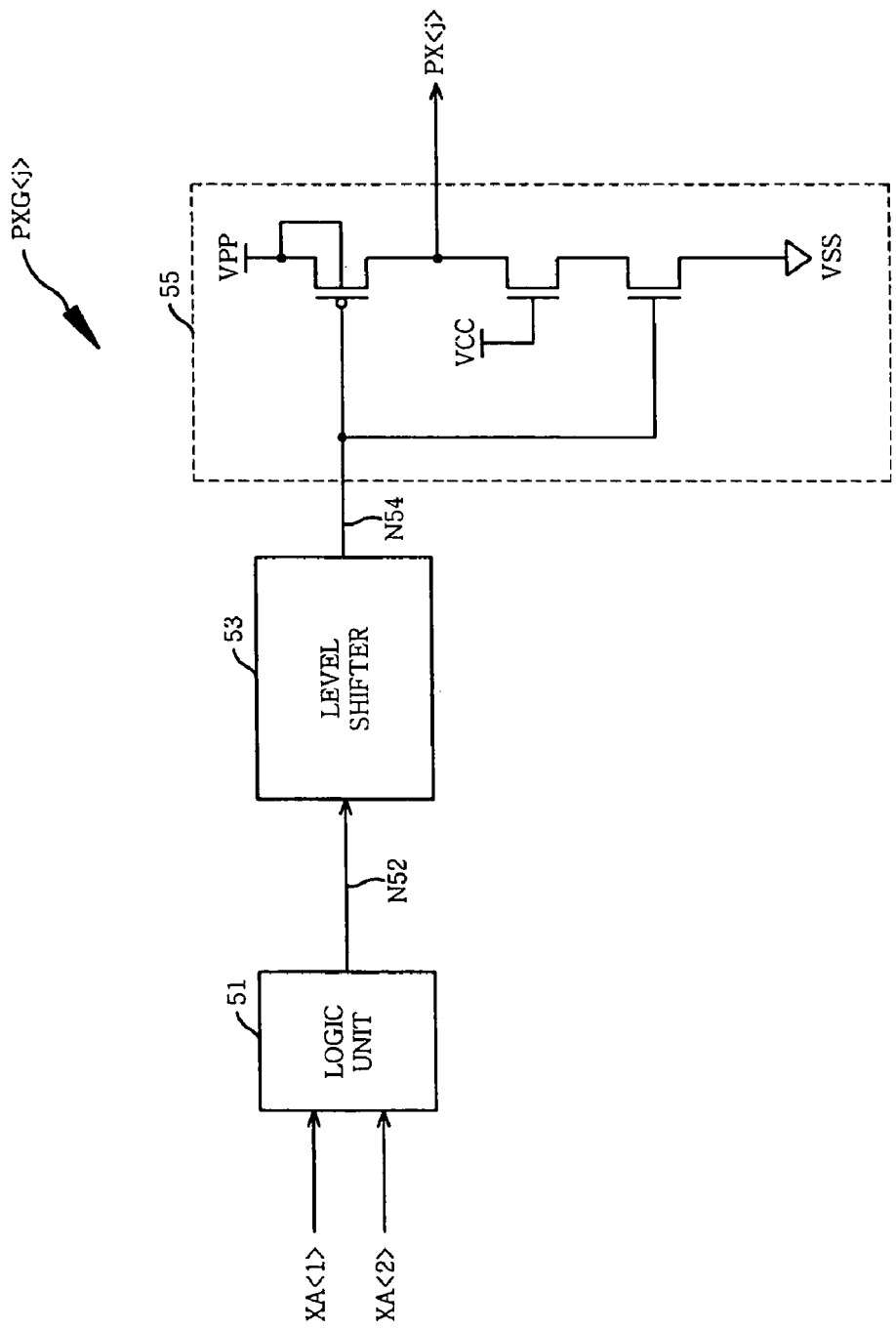
FIG. 5A is a diagram illustrating an exemplary decoding signal generator of the semiconductor memory device of FIG. 3 in more detail.

FIG. 5A is a diagram illustrating an exemplary decoding signal generator PXG<j> of decoding signal generators PXG<1> to PXG<4> of FIG. 3. Referring to FIG. 5A, decoding signal generator PXG<j> comprises a logic unit 51, a level shifter 53, and a driving unit 55. The implementation of logic unit 51 of decoding signal generator PXG<j> varies depending on the value of "j". Logic unit 51 outputs an output signal N52, and level shifter 53 shifts a power supply voltage level VCC of output signal N52 to a boost voltage level VPP. Furthermore, driving unit 55 outputs a decoding signal PX<j> having a boost voltage level VPP or a ground voltage level VSS in response to an output signal N54 of level shifter 53.

Decoding signal generators PXG<1> to PXG<4> generate decoding signals PX<1> to PX<4>, respectively, in response to X-addresses XA<1> and XA<2> provided by a predecoder 111. For example, when X-addresses XA<1> and XA<2> each have a logic low level ("L"), a first decoding signal PX<1> is output having a boost voltage level VPP (i.e., is enabled). When X-address XA<1> has a logic high level ("H"), and X-address XA<2> has a logic low level ("L"), a second decoding signal PX<2> is output having boost voltage level VPP. When X-address XA<1> has a logic low level ("L"), and X-address XA<2> a logic high level ("H"), a third decoding signal PX<3> is output having boost voltage level VPP. When X-addresses XA<1> and XA<2> each have a logic high level ("H"), a fourth decoding signal PX<4> is output having boost voltage level VPP.

Figure 5B:
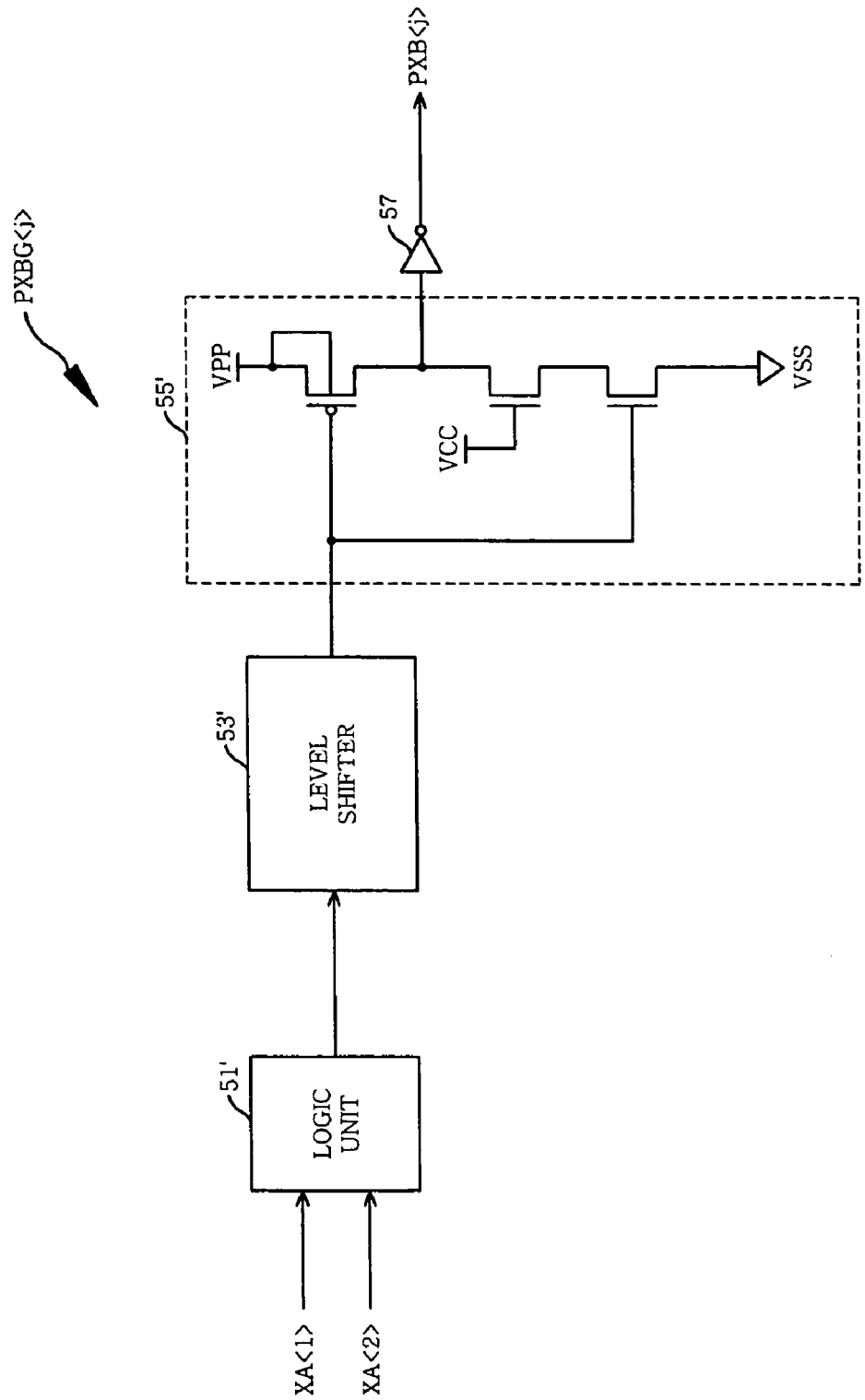
FIG. 5B is a diagram illustrating an exemplary inverted decoding signal generator of the semiconductor memory device of FIG. 3 in more detail.

FIG. 5B is a diagram illustrating an exemplary inverted decoding signal generator PXBG<j> of inverted decoding signal generators PXBG<1> to PXBG<4> of FIG. 3. Referring to FIG. 5B, like decoding signal generator PXG<j> of FIG. 5A, inverted decoding signal generator PXBG<j> comprises a logic unit 51', a level shifter 53', and a driving unit 55'. Inverted decoding signal generator PXBG<j> further comprises an inverter 57 adapted to invert the output signal of driving unit 55' and output an inverted decoding signal PXB<j>.

As a result, when decoding signal PX<j> is driven to a boost voltage level VPP, inverted decoding signal PXB<j> is output having a ground voltage level VSS. In addition, when decoding signal PX<j> is output having a ground voltage level VSS, inverted decoding signal PXB<j> is driven to power supply voltage level VCC.

Inverted decoding signal generator PXBG<j> of FIG. 5B may be implemented in a form that is independent of decoding signal generator PXG<j>. Alternatively, inverted decoding signal generator PXBG<j> may be implemented in such a way that inverted decoding signal generator PXBG<j> simply inverts decoding signal PX<j>, which is the output signal of decoding signal generator PXG<j> of FIG. 5A.

Figure 6:
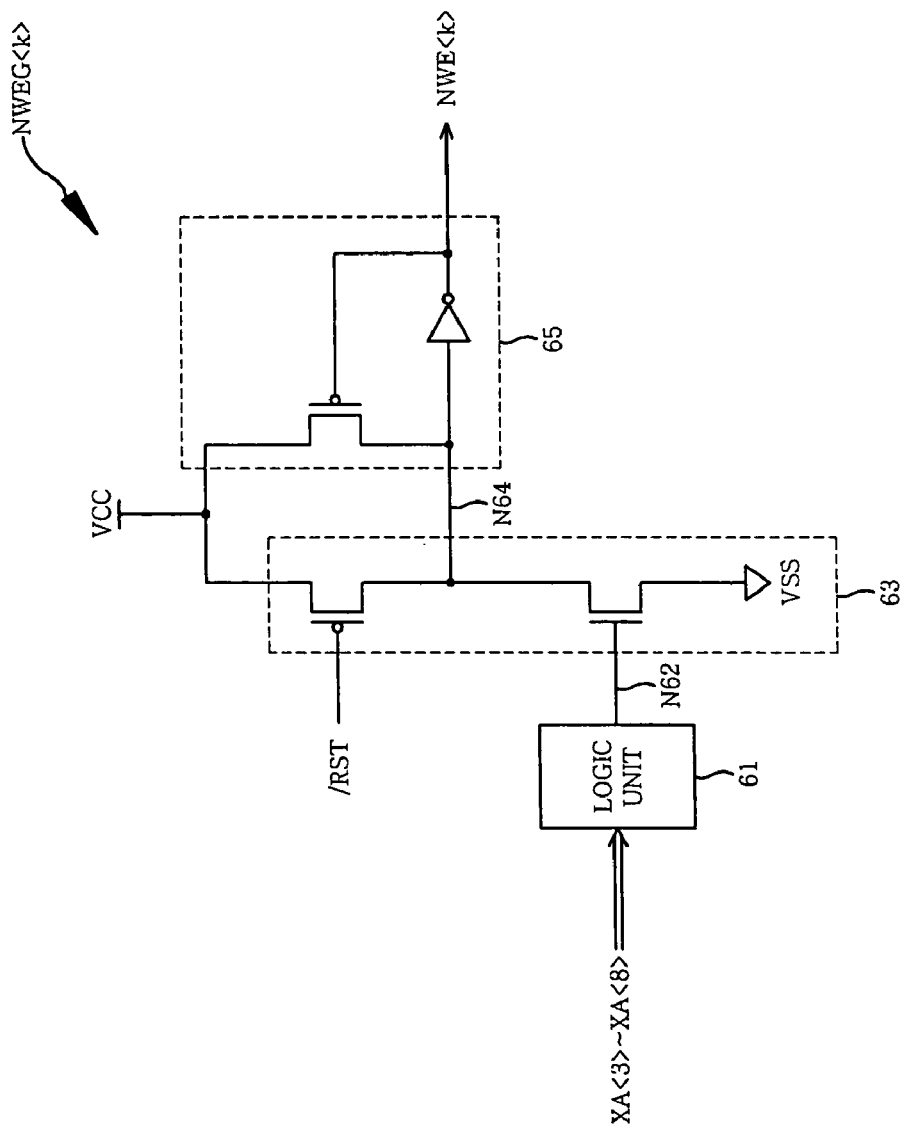
FIG. 6 is a diagram illustrating an exemplary enable signal generator of the semiconductor memory device of FIG. 3 in more detail.

FIG. 6 is a diagram illustrating an exemplary enable signal generator NWEG<k> of enable signal generators NWEG<1> to NWEG<64> of FIG. 3. Referring to FIG. 6, enable signal generator NWEG<k> comprises a logic unit 61, a driving unit 63, and a latch unit 65.

Logic unit 61 generates an output signal N62 which is activated (i.e., set to a logic high level) in accordance with X-addresses XA<3> to XA<8> provided by predecoder 111 (of FIG. 3). In addition, an output signal N64 of driving unit 63 is reset to a logic high level ("H") in response to a reset signal /RST, and output signal N64 is output having a logic low level ("L") in response to output signal N62 of logic unit 61. Furthermore, latch unit 65 inverts and latches output signal N64 of driving unit 63 and generates a word line enable signal NWE<k>.

Therefore, word line enable signal NWE<k> is reset to a logic low level ("L") in response to reset signal /RST. Furthermore, word line enable signal NWE<k> is enabled to a power supply voltage VCC in accordance with X-addresses XA<3> to XA<8>.

Figure 7:
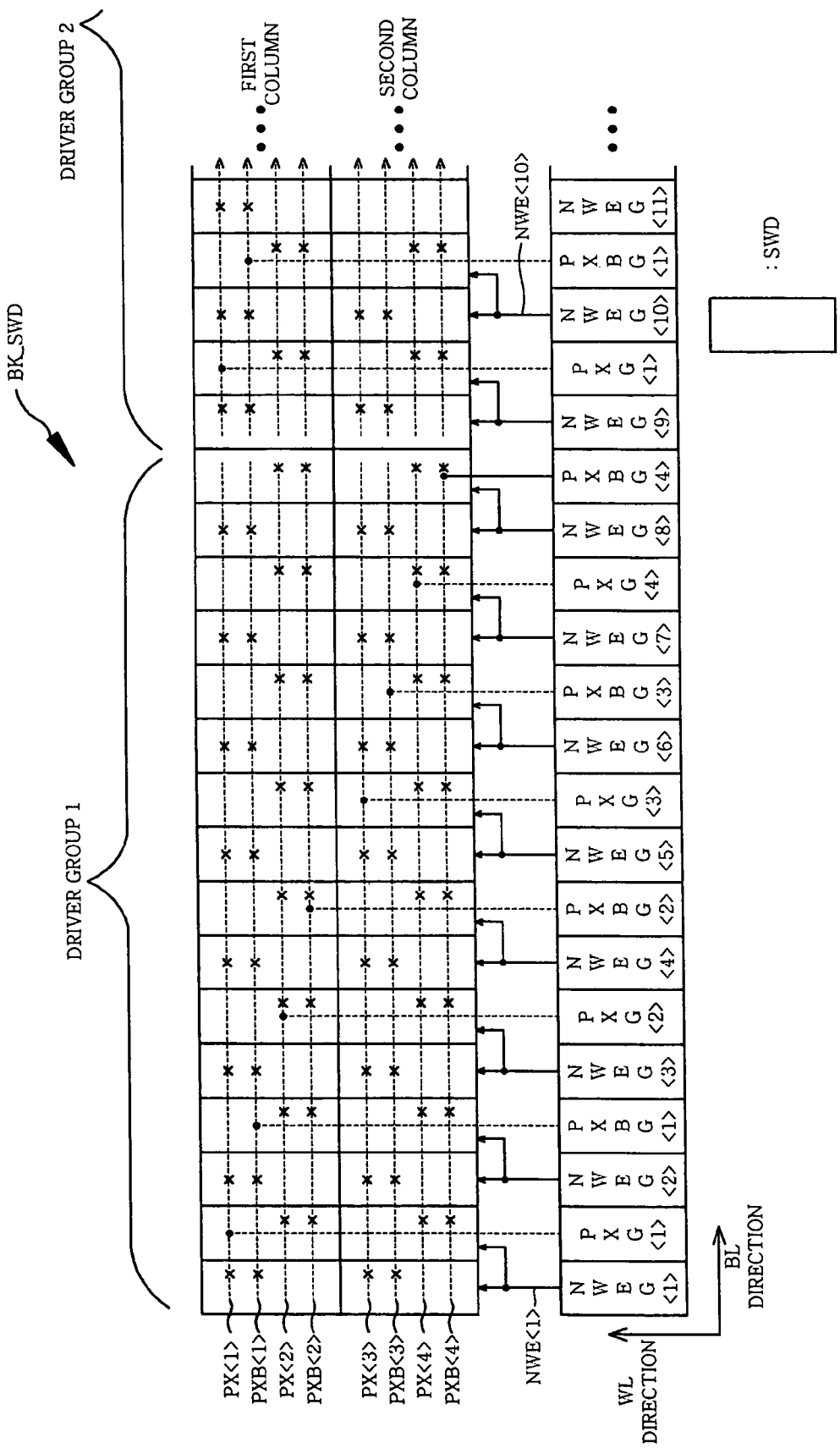
FIG. 7 is a diagram illustrating a portion of the arrangement of sub-word line drivers of the semiconductor memory device of FIG. 3 in more detail; and illustrating selected enable signal generators, decoding signal generators, and inverted decoding signal generators adapted to drive various sub-word line drivers of the semiconductor memory device of FIG. 3 in more detail.

FIG. 7 is a diagram illustrating a portion of the arrangement of sub-word line drivers SWDs; and illustrating selected generators of enable signal generators NWEG<1> to NWEG<64>, decoding signal generators PXG<1> to PXG<4>, and inverted decoding signal generators PXBG<1> to PXBG<4> of FIG. 3, which are adapted to drive sub-word line drivers SWDs. The portion of FIG. 3 illustrated in FIG. 7 is illustrated in more detail in FIG. 7 than in FIG. 3. For the purpose of clarity, elements of FIG. 7 are not necessarily drawn to scale.

Referring to FIG. 7, sub-word line drivers SWDs are arranged in first and second columns. Each rectangular box having a thick outline (an example of which is located at the bottom of FIG. 7) indicates a sub-word line driver SWD. When, as in the embodiment illustrated in FIGS. 3 and 7, each sub-array S_ARR comprises 256 word lines, 128 sub-word line drivers SWDs are disposed in each of the first and second columns.

When 128 sub-word line drivers SWDs are disposed in each of the first and second columns, sub-word line drivers SWDs disposed in the first column are driven in accordance with decoding signals PX<1> and PX<2> and inverted decoding signals PXB<1> and PXB<2>. In addition, sub-word line drivers SWDs disposed in the second column are driven in accordance with decoding signals PX<3> and PX<4> and inverted decoding signals PXB<3> and PXB<4>.

Also, sub-word line drivers SWDs, each of which is disposed in a word line driver area BK_SWD, are divided into a plurality of driver groups. In the embodiment illustrated in FIGS. 3 and 7, the sub-word line drivers SWDs disposed in a single word line driver area BK_SWD are divided into 8 driver groups. Furthermore, each driver group comprises 16 sub-word line drivers SWDs for each of the first and second columns, so each driver group comprises a total of 32 sub-word line drivers SWDs.

In this embodiment, decoding signal generators PXG<1> to PXG<4> and inverted decoding signal generators PXBG<1> to PXBG<4>, which generate decoding signals PX<1> to PX<4> and inverted decoding signals PXB<1> to PXB<4>, respectively, are connected to each driver group. Thus, there are multiple of each of decoding signal generators PXG<1> to PXG<4> and inverted decoding signal generators PXBG<1> to PXBG<4>. In addition, corresponding decoding signal generators PXG<j>, which are decoding signal generators PXG<j> having the same index (for example, all decoding signal generators PXG<1>), are activated by the same X-address signal, and corresponding inverted decoding signal generators PXBG<j>, which are inverted decoding signal generators PXBG<j> having the same index (for example, all inverted decoding signal generators PXBG<1>), are activated by the same X-address signal. Furthermore, two sub-word line drivers in each of the first and second columns (for a total of 4 sub-word line drivers SWDs) are connected to each word line enable signal NWE<k>. A first plurality of decoding signal generators PXG<1> to PXG<4> and inverted decoding signal generators PXBG<1> to PXBG<4> comprises one of each of decoding signal generators PXG<1> to PXG<4> and inverted decoding signal generators PXBG<1> to PXBG<4>. A plurality of first pluralities of decoding signal generators PXG<1> to PXG<4> and inverted decoding signal generators PXBG<1> to PXBG<4> corresponds to each word line driver area BK_SWD.

Decoding signal generators PXG<1> to PXG<4>, inverted decoding signal generators PXBG<1> to PXBG<4>, and enable signal generators NWEG<1> to NWEG<64> are preferably disposed in the bit line BL direction and disposed side by side forming a line that extends in the bit line BL direction.

In particular, as illustrated in FIGS. 3 and 7, decoding signal generators PXG<1> to PXG<4>, inverted decoding signal generators PXBG<1> to PXBG<4>, and enable signal generators NWEG<1> to NWEG<64> are preferably disposed such that consecutive enable signal generators NWEG<1> to NWEG<64> are separated by signal generators selected alternately from among decoding signal generators PXG<1> to PXG<4> and from among inverted decoding signal generators PXBG<1> to PXBG<4> yielding a pattern in the bit line direction of an enable signal generator, a decoding signal generator, an enable signal generator, an inverted decoding signal generator, etc.

In the embodiment illustrated in FIG. 3, 64 enable signal generators NWEG<1> to NWEG<64> correspond to one word line driver area BK_SWD. Thus, the embodiment illustrated in FIG. 3 comprises half as many enable signal generators NWEGs corresponding to each word line driver area BK_SWD as the conventional semiconductor memory device of FIGS. 1 and 2, which comprises 128 enable signal generators NWEGs corresponding to each word line driver area BK_SWD.

Figure 2:
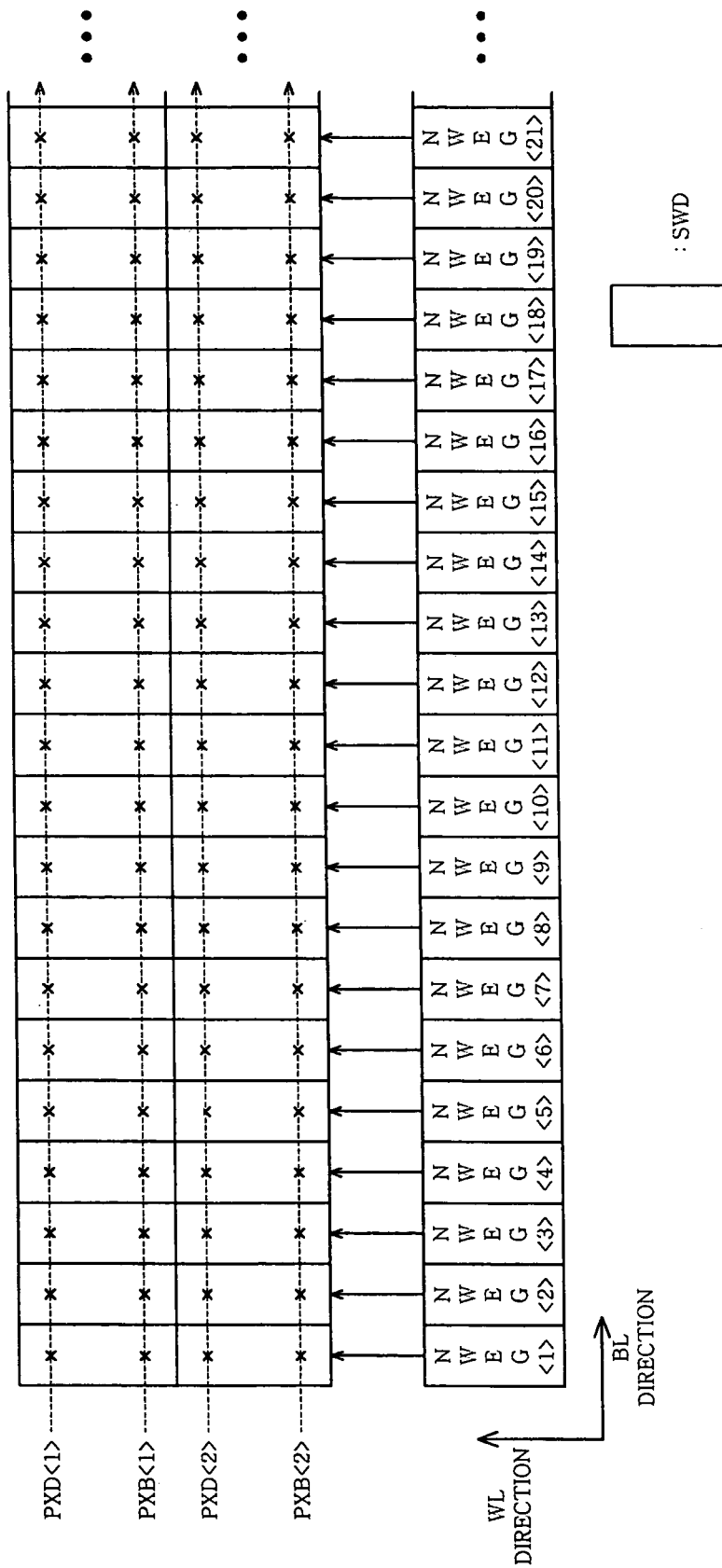
FIG. 2 is a diagram illustrating portion of FIG. 1 in more detail.

Furthermore, in the embodiment illustrated in FIG. 3, decoding signal generators PXG<1> to PXG<4> and inverted decoding signal generators PXBG<1> to PXBG<4> are disposed in the space freed in the semiconductor memory device by omitting half of the enable signal generators NWEGs compared to the number disposed in the conventional semiconductor memory device of FIGS. 1 and 2. In addition, like word line enable signals NWE<1> to NWE<64>, decoding signals PX<1> to PX<4> and inverted decoding signals PXB<1> to PXB<4> are bused in the word line WL direction to a corresponding plurality of sub-word line drivers SWDs disposed in a corresponding word line driver area BK_SWD.

In the semiconductor memory device of the embodiment of the invention illustrated in FIGS. 3 and 7, eight of each of decoding signal generators PXG<1> to PXG<4>, which are adapted to generate decoding signals PX<1> to PX<4>, respectively, and eight of each of inverted decoding signal generators PXBG<1> to PXBG<4>, which are adapted to generate inverted decoding signals PXB<1> to PXB<4>, respectively, may be disposed on a second side of each word line driver area BK_SWD.

Each of decoding signals PX<1> to PX<4> and inverted decoding signals PXB<1> to PXB<4> is connected to 16 sub-word line drivers SWDs. Thus, each decoding signal PX<j> and each inverted decoding signal PXB<j> is connected to $\frac{1}{16}^{th}$ as many sub-word line drivers SWDs as each delay decoding signal PXD<i> and each inverted decoding signal PXB<i> of the conventional semiconductor memory device of FIGS. 1 and 2, respectively, because each delay decoding signal PXD<i> and each inverted decoding signal PXB<i> of the conventional semiconductor memory device of FIGS. 1 and 2 is connected to 256 sub-word line drivers SWDs. Therefore, the load on each of decoding signals PX<1> to PX<4> and each of inverted decoding signals PXB<1> to PXB<4> decreases considerably relative to delay decoding signals PXD<1> PXD<2> and inverted decoding signals PXB<1> and PXB<2> of the conventional semiconductor memory device of FIGS. 1 and 2. Thus, the overall current consumption of the semiconductor memory device in accordance with an embodiment of the invention decreases relative to the conventional semiconductor memory device and the operation speed of the semiconductor memory device in accordance with an embodiment of the invention is improved considerably relative to the conventional semiconductor memory device.

In addition, the invention can be implemented in various different embodiments.

Figure 8:
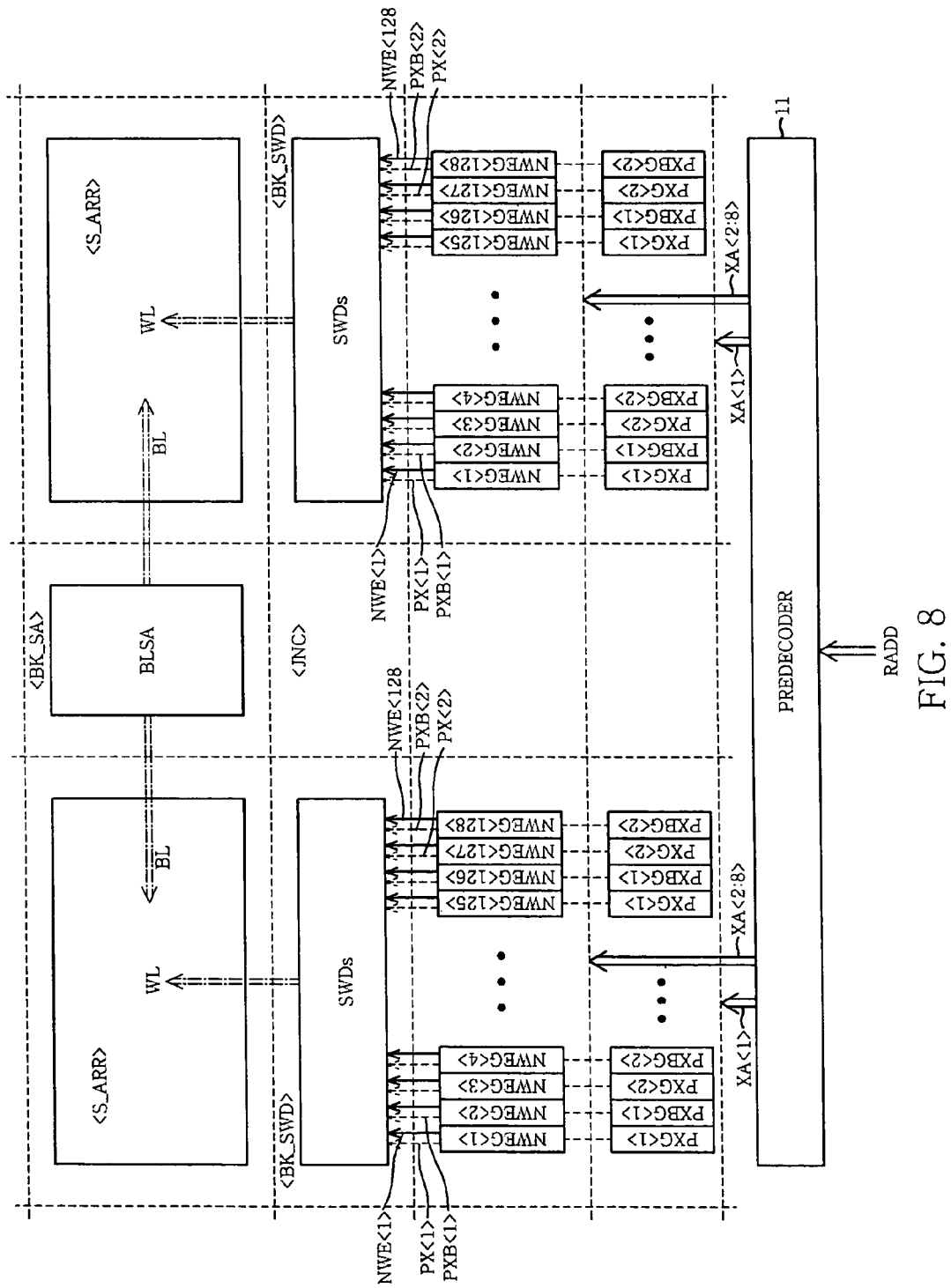
FIG. 8 is a diagram illustrating a semiconductor memory device in accordance with another embodiment of the invention; and, FIG. 9 is a diagram illustrating a semiconductor memory device in accordance with still another embodiment of the invention.

FIG. 8 is a diagram illustrating a semiconductor memory device in accordance with another embodiment of the invention. As in the embodiment illustrated in FIG. 3, in the embodiment illustrated in FIG. 8, a first word line driver area BK_SWD is disposed on a first side of a first sub-array S_ARR, first sub-array S_ARR is disposed on the first side of word line driver area BK_SWD, and decoding signal generators PXG<1> and PXG<2>, inverted decoding signal generators PXBG<1> and PXBG<2>, and enable signal generators NWEG<1> to NWEG<128> that correspond to first sub-array S_ARR are all disposed on a first side of first sub-array S_ARR and on a second side of first word line driver area BK_SWD opposite the first side of first word line driver area BK_SWD. Furthermore, decoding signals PX<1> and PX<2> and inverted decoding signals PXB<1> and PXB<2> are bused in the word line direction, as are word line enable signals NWE<1> to NWE<128>.

However, unlike the embodiment illustrated in FIG. 3, in the embodiment illustrated in FIG. 8, decoding signal generators PXG<1> and PXG<2> and inverted decoding signal generators PXBG<1> and PXBG<2> are disposed forming a different line than the line formed by enable signal generators NWEG<1> to NWEG<128>.

That is, in the embodiment illustrated in FIG. 3, decoding signal generators PXG<1> to PXG<4>, inverted decoding signal generators PXBG<1> to PXBG<4>, and enable signal generators NWEG<1> to NWEG<64> are all disposed forming a first line. In contrast, in the embodiment illustrated in FIG. 8, enable signal generators NWEG<1> to NWEG<128> are disposed forming a first line, as in the conventional semiconductor memory device of FIGS. 1 and 2, but decoding signal generators PXG<1> and PXG<2> and inverted decoding signal generators PXBG<1> and PXBG<2> are disposed forming a second line that is separated from the first line. As illustrated in FIG. 8, the first and second lines extend in the bit line BL direction.

In the embodiment illustrated in FIG. 8, 128 enable signal generators NWEG<1> to NWEG<128> correspond to one word line driver area BK_SWD. Furthermore, each of word line enable signals NWE<1> to NWE<128> controls two sub word line drivers SWDs, as in the conventional semiconductor memory device of FIGS. 1 and 2.

Furthermore, in the embodiment illustrated in FIG. 8, 32 of each of decoding signal generators PXG<1> and PXG<2>, which are adapted to generate decoding signals PX<1> and PX<2>, and 32 of each of inverted decoding signal generators PXBG<1> and PXBG<2>, which are adapted to generate inverted decoding signals PXB<1> and PXB<2>, are disposed corresponding to each of word line driver areas BK_SWDs. In addition, corresponding decoding signal generators PXG<i>, which are decoding signal generators PXG<i> having the same index (for example, all decoding signal generators PXG<1>), are activated in response to the same address signal, and corresponding inverted decoding signal generators PXGB<i>, which are inverted decoding signal generators PXGB<i> having the same index (for example, all inverted decoding signal generators PXGB<1>), are activated in response to the same address signal. A first plurality of decoding signal generators PXG<1> and PXG<2> comprises one of each of decoding signal generators PXG<1> and PXG<2>. A plurality of first pluralities of decoding signal generators PXG<1> and PXG<2> corresponds to each word line driver area BK_SWD.

As a result, each of decoding signals PX<1> and PX<2> and inverted decoding signals PXB<1> and PXB<2> is connected to four sub-word line drivers SWDs. That is, each decoding signal PX<i> output by a distinct decoding signal generator PXG<i> is connected to four sub-word line drivers SWDs, and each inverted decoding signal PXB<i> output by a distinct inverted decoding signal generator PXBG<i> is connected to four sub-word line drivers SWDs.

Thus, each decoding signal PX<i> and each inverted decoding signal PXB<i> is connected to $\frac{1}{64}^{th}$ as many sub-word line drivers SWDs as each delay decoding signal PXD<i> and each inverted decoding signal PXB<i> of the conventional semiconductor memory device illustrated in FIGS. 1 and 2, respectively, because each delay decoding signal PXD<i> and each inverted decoding signal PXB<i> of the conventional semiconductor memory device illustrated in FIGS. 1 and 2 is connected to 256 sub-word line drivers SWDs.

Figure 9:
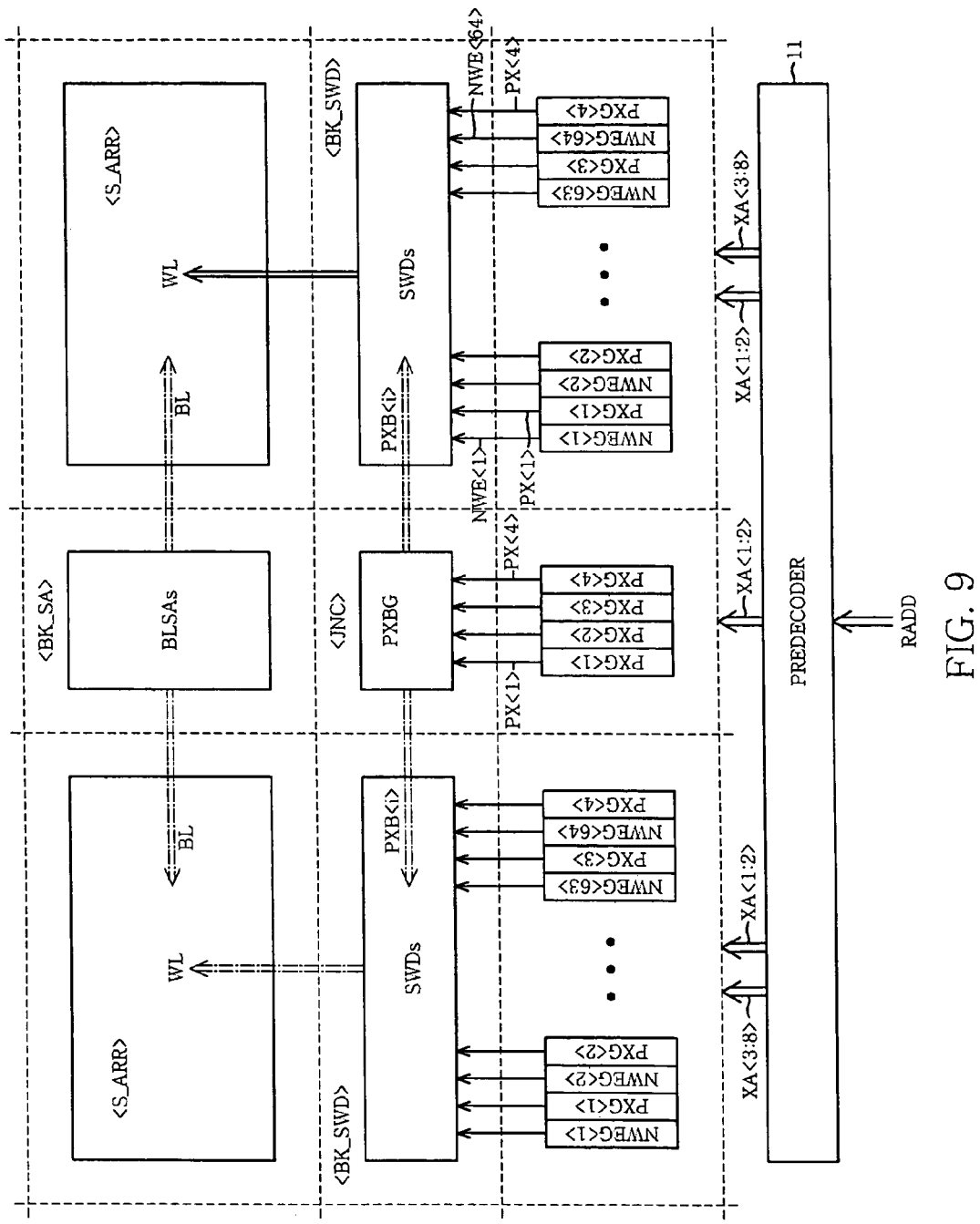

FIG. 9 is a diagram illustrating a semiconductor memory device in accordance with another embodiment of the invention. As in the embodiment illustrated in FIG. 3, in the embodiment illustrated in FIG. 9, a first word line driver area BK_SWD is disposed on a first side of a first sub-array S_ARR, first sub-array S_ARR is disposed on a first side of first word line driver area BK_SWD, and decoding signal generators PXG<1> to PXG<4>, which generate decoding signals PX<1> to PX<4>, respectively, and enable signal generators NWEG<1> to NWEG<64> are disposed on a first side of first sub-array S_ARR and on a second side of first word line driver area BK_SWD opposite the first side of first word line driver area BK_SWD. Also, the decoding signal generators PXG<1> to PXG<4> and the enable signal generators NWEG<1> to NWEG<64> that are disposed on a first side of first sub-array S_ARR form a line extending in the bit line direction.

However, unlike the embodiment illustrated in FIG. 3, in the embodiment illustrated in FIG. 9, inverted decoding signal generators PXBG<1> to PXBG<4> are disposed in junction area JNC. In FIG. 9, inverted decoding signal generators PXBG<1> to PXBG<4> are illustrated collectively as PXBG disposed in junction area JNC.

In the embodiment illustrated in FIG. 9, inverted decoding signals PXB<1> to PXB<4> are bused in the bit line BL direction. In addition, inverted decoding signals PXB<1> to PXB<4> are connected to (i.e., shared by) sub-word line drivers SWDs of the driver groups disposed in a first word line driver area BK_SWD disposed adjacent to junction area JNC and sub-word line drivers SWDs of the driver groups disposed in a second word line driver area BK_SWD disposed adjacent to junction area JNC.

Furthermore, each word line enable signal NWE<k> controls four sub word line drivers SWDs, which is the same as in the embodiment illustrated in FIG. 3. However, each of decoding signals PX<1> to PX<4> is connected to eight sub-word line drivers SWDs. That is, each decoding signal PX<j> output by a distinct decoding signal generator PXG<j> is connected to eight sub-word line drivers SWDs. So, each decoding signal PX<j> is connected to $\frac{1}{32}^{nd}$ as many sub-word line drivers SWDs as each decoding signal PDX<i> of the conventional semiconductor memory device illustrated in FIGS. 1 and 2, which are each connected to 256 sub-word line drivers SWDs.

The embodiment illustrated in FIG. 9 simultaneously provides benefits in terms of both layout area and reduction of the load of decoding signals PX<1> to PX<4> (which are driven to a boost voltage) relative to the load of delay decoding signals PXD<1> and PXD<2> of the conventional semiconductor memory device illustrated in FIGS. 1 and 2.

In addition, inverted decoding signals PXB<1> to PXB<4> are driven to a power supply voltage VCC, so inverted decoding signals PXB<1> to PXB<4> do not have a large load compared to that of decoding signals PX<1> to PX<4>.

Also, corresponding decoding signal generators PXG<j>, which are decoding signal generators PXG<j> having the same index (for example, all decoding signal generators PXG<1>), are activated by the same X-address signal, and corresponding inverted decoding signal generators PXBG<j>, which are inverted decoding signal generators PXBG<j>having the same index (for example, all inverted decoding signal generators PXBG<1>), are activated by the same X-address signal. A first plurality of decoding signal generators PXG<1> to PXG<4> comprises one of each of decoding signal generators PXG<1> to PXG<4>. A plurality of first pluralities of decoding signal generators PXG<1> to PXG<4> corresponds to each word line driver area BK_SWD.

Furthermore, in embodiments of the invention in which decoding signals are bused in the word line direction, it is not necessary to separately provide delay decoding signals PXD to sub-word line driver SWDs, and a delay decoding signal generator PXDG is not necessary.

The invention may be implemented is embodiments other than those described herein. Furthermore, the invention may be implemented through embodiments comprising a combination of elements from other embodiments of the invention.

In accordance with embodiments of the invention, decoding signal generators are disposed on a second side of each word line driver area and disposed adjacent to each word line driver area in a word line direction. Furthermore, decoding signals are communicated solely in the word line direction along with word line enable signals.

In accordance with embodiments of the invention, the sub-word line drivers disposed in one word line driver area are divided into a plurality of driver groups. Furthermore, a plurality of first pluralities of decoding signal generators corresponds to each word line driver area. Respective decoding signal generators of each first plurality of decoding signal generators are all activated by the same address signal. In addition, a first plurality of decoding signal generators is connected to each driver group, and the decoding signal generators generate decoding signals.

In accordance with embodiments of the invention, the number of sub-word line drivers to which each decoding signal is connected is decreased considerably, so that the load of the decoding signals may be reduced. As a result, for a semiconductor memory device in accordance with an embodiment of the invention, overall power consumption decreases considerably, and operation speed is improved considerably.

Although embodiments of the invention have been disclosed herein, various modifications, additions, and substitutions may be made to the embodiments by those skilled in the art without departing from the scope of the invention as defined by the accompanying claims.

What is claimed is:

1. A semiconductor memory device comprising:
    a sub-array comprising a plurality of memory cells connected between a plurality of bit lines and a plurality of word lines arranged in a direction perpendicular to the plurality of bit lines, wherein the sub-array is arranged in a sub-array area;
    a plurality of sub-word line drivers divided into a plurality of groups and coupled to the plurality of word lines, wherein each of the plurality of groups includes a predetermined number of sub-word line drivers, wherein the plurality of sub-word line drivers is arranged in a word line driver area;
    a plurality of enable signal generators adapted to generate word line enable signals, wherein the pluralitv of enable signal generators are arranged in a signal generator area;
    a plurality of decoding signal generators adapted to generate decoding signals, wherein the plurality of decoding signal generators are arranged in the signal generator area; and,
    a plurality of inverted decoding signal generators adapted to generate inverted decoding signals,
    wherein:
        each sub-word line driver is adapted to drive a word line corresponding to at least one of the memory cells in accordance with one of the word line enable signals and a pair of signals comprising one of the decoding signals and one of the inverted decoding signals,
        the word line enable signals and the decoding signals are communicated to the sub-word line drivers solely in a word line direction, and
        the word line driver area is located between the sub-array area and the signal generator area.

2. The semiconductor memory device of claim 1, wherein the plurality of enable signal generators and the plurality of decoding signal generators are disposed side by side in a bit line direction on a first side of the sub-array area.

3. The semiconductor memory device of claim 2, wherein the plurality of enable signal generators and the plurality of decoding signal generators are disposed side by side one another forming a first line.

4. The semiconductor memory device of claim 2, wherein the plurality of enable signal generators and the plurality of decoding signal generators are alternately disposed in the signal generator area.

5. The semiconductor memory device of claim 2, wherein:
    the enable signal generators are disposed forming a first line in the bit line direction, and the decoding signal generators are disposed forming a second line in the bit line direction, wherein the second line is different from the first line.

6. The semiconductor memory device of claim 1, wherein:
    the enable signal generators are adapted to provide the word line enable signals to the sub-word line drivers; and,
    the decoding signal generators are adapted to provide the decoding signals to the sub-word line drivers.

7. The semiconductor memory device of claim 1, wherein the inverted decoding signal generators are adapted to provide the inverted decoding signals to the sub-word line drivers in a bit line direction.

8. The semiconductor memory device of claim 1, wherein the enable signal generators, the decoding signal generators, and the inverted decoding signal generators are disposed forming at least one line in a bit line direction on a first side of the sub-array.

9. The semiconductor memory device of claim 8, wherein the enable signal generators, the decoding signal generators, and the inverted decoding signal generators are disposed side by side one another forming a first line.

10. The semiconductor memory device of claim 8, wherein the enable signal generators, the decoding signal generators, and the inverted decoding signal generators are alternately disposed in the signal generator area.

11. The semiconductor memory device of claim 8, wherein:
    the enable signal generators are disposed forming a first line; and
    the decoding signal generators and the inverted decoding signal generators are disposed forming a second line different from the first line.

12. The semiconductor memory device of claim 8, wherein the enable signal generators, the decoding signal generators, and the inverted decoding signal generators are respectively adapted to provide the word line enable signals, the decoding signals, and the inverted decoding signals to the plurality of word line drivers.

* * * * *